(12) United States Patent
Kim et al.

(10) Patent No.: US 9,169,425 B2
(45) Date of Patent: Oct. 27, 2015

(54) ADHESIVE FILM AND ELECTRONIC DEVICE INCLUDING THE SAME

(71) Applicants: Hye Jin Kim, Uiwang-si (KR); Jae Won Choi, Uiwang-si (KR); Ji Ho Kim, Uiwang-si (KR); Jin Man Kim, Uiwang-si (KR); Gyu Seok Song, Uiwang-si (KR)

(72) Inventors: Hye Jin Kim, Uiwang-si (KR); Jae Won Choi, Uiwang-si (KR); Ji Ho Kim, Uiwang-si (KR); Jin Man Kim, Uiwang-si (KR); Gyu Seok Song, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 308 days.

(21) Appl. No.: 13/713,679

(22) Filed: Dec. 13, 2012

(65) Prior Publication Data
US 2013/0154125 A1   Jun. 20, 2013

(30) Foreign Application Priority Data
Dec. 16, 2011   (KR) .......................... 10-2011-0136327

(51) Int. Cl.
| | | |
|---|---|---|
| H01L 23/48 | (2006.01) | |
| H01L 23/52 | (2006.01) | |
| H01L 29/40 | (2006.01) | |
| C09J 163/00 | (2006.01) | |
| H01L 23/00 | (2006.01) | |
| C08G 59/50 | (2006.01) | |
| C08G 59/56 | (2006.01) | |
| C08G 59/62 | (2006.01) | |

(52) U.S. Cl.
CPC ............. *C09J 163/00* (2013.01); *C08G 59/504* (2013.01); *C08G 59/56* (2013.01); *C08G 59/621* (2013.01); *H01L 24/29* (2013.01); *H01L 24/50* (2013.01); *H01L 24/32* (2013.01); *H01L 2224/2929* (2013.01); *H01L 2224/2939* (2013.01); *H01L 2224/29291* (2013.01); *H01L 2224/29339* (2013.01); *H01L 2224/29344* (2013.01); *H01L 2224/29347* (2013.01); *H01L 2224/29355* (2013.01); *H01L 2224/29386* (2013.01); *H01L 2224/29391* (2013.01); *H01L 2224/29393* (2013.01); *H01L 2224/32225* (2013.01); *H01L 2224/83101* (2013.01)

(58) Field of Classification Search
None
See application file for complete search history.

(56) References Cited

U.S. PATENT DOCUMENTS

| | | | |
|---|---|---|---|
| 2004/0079464 A1* | 4/2004 | Kumakura .................... 156/60 |
| 2006/0040202 A1* | 2/2006 | Yahagi ..................... 430/270.1 |
| 2009/0110940 A1* | 4/2009 | Hong et al. .................. 428/447 |
| 2010/0063181 A1* | 3/2010 | Muller-Frischinger ....... 523/400 |

FOREIGN PATENT DOCUMENTS

| | | |
|---|---|---|
| KR | 10 2009-0056570 A | 6/2009 |
| KR | 10 2009-0103434 A | 10/2009 |
| TW | 200948921 A1 | 12/2009 |
| TW | 201000586 A1 | 1/2010 |

OTHER PUBLICATIONS

Taiwanese Office Action dated May 12, 2014.

* cited by examiner

*Primary Examiner* — Evan Pert
*Assistant Examiner* — Shaka White
(74) *Attorney, Agent, or Firm* — Lee & Morse, P.C.

(57) ABSTRACT

An adhesive film includes an amine curing agent and a phenolic curing agent, and has a ratio of a storage modulus at 170° C. after 80% or more curing to a storage modulus at 40° C. before curing in the range of about 1.5 to about 3.0.

13 Claims, 1 Drawing Sheet

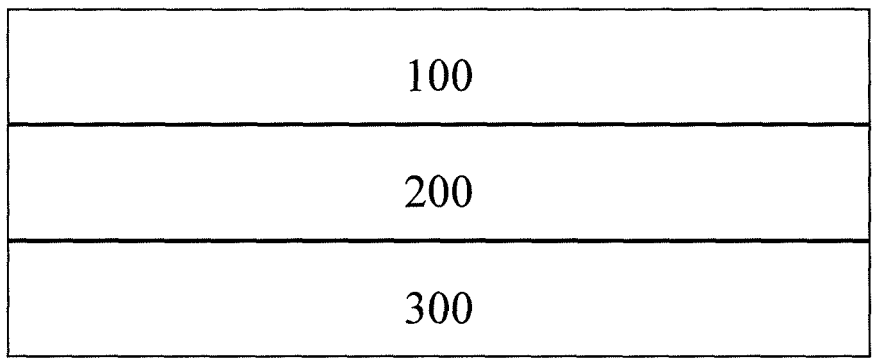

ADHESIVE FILM AND ELECTRONIC DEVICE INCLUDING THE SAME

CROSS-REFERENCE TO RELATED PATENT APPLICATION

The present application claims priority under 35 U.S.C. §119 to Korean Patent Application No. 10-2011-0136327, filed on Dec. 16, 2011, in the Korean Intellectual Property Office, and entitled: "Adhesive Film For Semiconductor and Semiconductor Device Using the Same," which is incorporated by reference herein in its entirety.

BACKGROUND

1. Field

Embodiments relate to an adhesive film that contains both an amine curing agent and phenolic curing agent.

2. Description of the Related Art

Recently, with increasing trend of size reduction or high capacity of semiconductor diodes, an adhesive film is used to attach semiconductor diodes to each other or to a support member. An adhesive film for semiconductor assembly is used together with a dicing film in order to hold a semiconductor wafer in a dicing process.

In assembly of a semiconductor wafer, with a dicing film and an adhesive film mounted on the semiconductor wafer, the semiconductor wafer is cut into individual chips in a sawing process, and the chips are stacked at high temperature in die attachment. To hold the stacked chips, pre-curing is performed at 125° C. to 150° C. for a predetermined period of time, and finished semiconductor diodes are subjected to EMC molding.

SUMMARY

Embodiments are directed to an adhesive film including an amine curing agent, and a phenolic curing agent. The adhesive film has a ratio of a storage modulus at 170° C. after 80% or more curing to a storage modulus at 40° C. before curing in the range of about 1.5 to about 3.0.

The amine curing agent may be 3,3'-diaminobenzidine, 4,4'-diaminodiphenyl methane, 4,4'- or 3,3'-diaminodiphenyl sulfone, 4,4'-diaminobenzophenone, p-phenylenediamine, m-phenylenediamine, m-toluenediamine, 4,4'-diaminodiphenyl ether, 4,4'- or 3,3'-diaminobenzophenone, 1,4'- or 1,3'-bis(4- or 3-aminocumyl)benzene, 1,4'-bis(4- or 3-aminophenoxy)benzene, 2,2'-bis[4-(4- or 3-aminophenoxy)phenyl]propane, bis[4-(4- or 3-aminophenoxy)phenyl]sulfone, 2,2'-bis[4-(4- or 3-aminophenoxy)phenyl]hexafluorosulfone, 2,2'-bis[4-(4- or 3-aminophenoxy)phenyl]hexafluoropropane, 4,4'-diamino-3,3',5,5'-tetrabutyl diphenylketone, 4,4'-diamino-3,3',5,5'-tetraethyldiphenylketone, 4,4'-diamino-3,3',5,5'-tetra-n-propylenediphenylketone, 4,4'-diamino-3,3',5,5'-tetraisopropyldiphenylketone, 4,4'-diamino-3,3',5,5'-tetramethyldiphenylketone, 4,4'-diamino-3,3',5,5'-tetra-n-propyldiphenylmethane, 4,4'-diamino-3,3'5,5'-tetramethyldiphenylmethane, 4,4'-diamino-3,3'5,5'-tetraisopropyldiphenylmethane, 4,4'-diamino-3,3'5,5'-tetraethyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diethyldiphenylmethane, 4,4'-diamino-3,5'-dimethyl-3',5'-diethyldiphenylmethane, 4,4'-diamino-3,5-dimethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenyl methane, 4,4'-diamino-3,3'-diisopropyl-5,5'-dibutyldiphenylmethane, 4,4'-diamino-3,3'-dimethyl-5',5'-dibutyldiphenylmethane, 4,4'-diamino-3,3'-diethyl-5',5'-dibutyldiphenyl methane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-methyl-3'-butyldiphenylmethane, 4,4'-diamino-3-isopropyl-3'-butyldiphenylmethane, 2,2-bis(4-amino-3,5-dimethylphenyl)propane, 2,2-bis(4-amino-3,5-diethylphenyl)propane, 2,2-bis(4-amino-3,5-di-n-propylphenyl)propane, 2,2-bis(4-amino-3,5-diisopropylphenyl)propane, 2,2-bis(4-amino-3,5-dibutylphenyl)propane, 4,4'-diamino-3,3',5,5'-tetramethyldiphenylbenzanilide, 4,4'-diamino-3,3',5,5'-tetraethyldiphenylbenzanilide, 4,4'-diamino-3,3',5,5'-tetra-n-propyldiphenylbenzanilide, 4,4'-diamino-3,3',5,5'-tetraisopropyldiphenylbenzanilide, 4,4'-diamino-3,3',5,5'-tetrabutyldiphenylbenzanilide, 4,4'-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'-tetramethyldiphenylether, 4,4'-diamino-3,3',5,5'-tetraethyldiphenylether, 4,4'-diamino-3,3',5,5'-tetra-n-propyldiphenylether, 4,4'-diamino-3,3',5,5'-tetraisopropyldiphenylether, 4,4'-diamino-3,3',5,5'-tetrabutyldiphenylether, 3,3'-diaminobenzophenone, 3,4-diaminobenzophenone, 3,3'-diaminodiphenylether, 3,3'-diaminodiphenylmethane, 3,4-diaminodiphenylmethane, 2,2'-diamino-1,2-diphenylethane or 4,4'-diamino-1,2-diphenylethane, 2,4-diaminodiphenylamine, 4,4'-diamino octafluorobiphenyl, or o-dianisidine. The amine curing agent may be diamino diphenyl sulfone.

The phenolic curing agent may be a bisphenol resin, a phenol novolac resin, a bisphenol A novolac resin, a xylene resin, a cresol novolac resin, or a biphenyl resin. The phenolic curing agent may be bisphenol A or bisphenol F.

The adhesive film may have a post-molding die-shear strength of 9 kgf or more after curing at 125° C. for 1 hour, at 150° C. for 10 minutes, and at 175° C. for 1 hour.

The adhesive film may have a void area ratio of 5% or less on an adhesive film-attached area, after curing at 125° C. for 1 hour and at 150° C. for 1 hour, molding at 175° C. for 60 seconds, and mold curing at 175° C. for 1 hour.

Embodiments are also directed to an adhesive film including an amine curing agent, and a phenolic curing agent, the adhesive film having a die-shear strength of 9 kgf or more after curing at 125° C. for 1 hour and at 175° C. for 1 hour, and a storage modulus at 170° C. of $5.0 \times 10^6$ dyne/cm$^2$ or more after 80% curing.

The adhesive film may have a void area ratio of 5% or less on an adhesive film-attached area, after curing at 125° C. for 1 hour and at 150° C. for 1 hour, molding at 175° C. for 60 seconds, and mold curing at 175° C. for 1 hour.

The amine curing agent may be diamino diphenyl sulfone. The phenolic curing agent may be bisphenol A or bisphenol F.

Embodiments are also directed to an adhesive film including a binder resin, an epoxy resin, a filler, an amine curing agent, and a phenolic curing agent. The mole % ratio of the amine curing agent to the phenolic curing agent ranges from about 0.3 to about 10.

A ratio of a storage modulus at 170° C. after 80% curing to a storage modulus at 40° C. before curing may range from about 1.5 to about 3.0.

The adhesive film may have a die-shear strength of 9 kgf or more after curing at 125° C. for 1 hour, at 150° C. for 10 minutes, and at 175° C. for 1 hour.

The adhesive film may include about 40 to about 80 parts by weight of the binder resin, about 1 to about 30 parts by weight of the epoxy resin, about 1 to about 30 parts by weight of the filler, about 0.1 to about 20 parts by weight of the amine curing agent, and about 0.1 to about 20 parts by weight of the phenolic curing agent, based on 100 parts by weight of the adhesive film in terms of solid content.

The binder resin may be an elastomer resin.

The amine curing agent may be diamino diphenyl sulfone. The phenolic curing agent may be bisphenol A or bisphenol F.

Embodiments are also directed to an electronic device including a wiring substrate, an adhesive film attached to a chip mounting surface of the wiring substrate, and a semiconductor chip mounted on the adhesive film. The adhesive film may be an adhesive film including an amine curing agent, and a phenolic curing agent. The adhesive film may have a ratio of a storage modulus at 170° C. after 80% or more curing to a storage modulus at 40° C. before curing in the range of about 1.5 to about 3.0.

BRIEF DESCRIPTION OF THE DRAWING

Features will become apparent to those of skill in the art by describing in detail exemplary embodiments with reference to the attached drawing in which FIG. 1 illustrates a semiconductor device according to an embodiment.

DETAILED DESCRIPTION

Embodiments will now be described in detail. It should be understood that the following embodiments are provided for illustration only and are not to be construed in any way as limiting the scope thereof.

According to embodiments, an adhesive film may include an amine curing agent and a phenolic curing agent. The adhesive film may include a polymer resin, an epoxy resin, a curing agent, fillers, and other additives. Next, detailed examples of the components suitable for use in the adhesive film will be described.

Polymer Resin

Any suitable polymer resin may be used. Examples of polymer resins suitable for use in the adhesive film may include polyimide resins, polystyrene resins, polyethylene resins, polyester resins, polyamide resins, butadiene rubbers, acrylic rubbers, (meth)acrylate resins, urethane resins, polyphenylene ether resins, polyether imide resins, phenoxy resins, polycarbonate resins, modified polyphenylene ether resins, and mixtures thereof. For example, these resins may be used alone or as a mixture of two or more thereof.

Further, a functional monomer-containing polymer resin, for example, an epoxy group-containing (meth)acrylic copolymer containing a functional monomer, such as glycidyl acrylate, glycidyl methacrylate, and the like, may be used. As the epoxy group-containing (meth)acrylic copolymer, (meth)acrylic ester copolymer or acryl rubbers may be used. These may be used alone or as a mixture of two or more thereof.

The polymer resin may be an elastomer resin. Any suitable elastomer resin may be used. Examples of elastomer resins may include acrylonitrile, butadiene, styrene, acryl, isoprene, ethylene, propylene, polyurethane, and silicone resins, without being limited thereto. These may be used alone or as a mixture of two or more thereof.

The elastomer resin may have a weight average molecular weight from about 50,000 g/mol to about 5,000,000 g/mol, for example, from about 100,000 g/mol to about 800,000 g/mol.

The polymer resin may be in an amount of about 40 to about 80 parts by weight, for example, about 50 to about 70 parts by weight, based on 100 parts by weight of the adhesive film in terms of solid content. Within this range, the adhesive film may have good void characteristics and high reliability.

Epoxy Resin

Any suitable epoxy resin may be used. The epoxy resin may include at least one of liquid epoxy resins and solid epoxy resins.

Examples of suitable liquid epoxy resins include bisphenol A type liquid epoxy resins, bisphenol F type liquid epoxy resins, tri- or higher polyfunctional liquid epoxy resins, rubber-modified liquid epoxy resins, urethane-modified liquid epoxy resins, acrylic modified liquid epoxy resins, and photosensitive liquid epoxy resins. These liquid epoxy resins may be used alone or as a mixture of two or more thereof.

The liquid epoxy resin may have an epoxy equivalent weight from about 100 to about 1500 g/eq, for example from about 150 g/eq to about 800 g/eq, or from about 150 g/eq to about 400 g/eq. Within this range, a cured product with good adhesion and heat resistance while maintaining high glass transition temperature may be obtained.

The liquid epoxy resin may have a weight average molecular weight in the range of about 100 g/mol to about 1,000 g/mol. This range may be advantageous in providing high flowability.

The solid epoxy resin may be one that is a solid or quasi-solid at room temperature and has one or more functional groups. Examples of suitable solid epoxy resins may include bisphenol type epoxy resins, phenol novolac type epoxy resins, o-cresol novolac type epoxy resins, polyfunctional epoxy resins, amine epoxy resins, heterocyclic epoxy resins, substituted epoxy resins, naphthol-based epoxy resins, and derivatives thereof, without being limited thereto.

Commercially available epoxy resins may include the following. Examples of bisphenol epoxy resins may include YD-017H, YD-020, YD020-L, YD-014, YD-014ER, YD-013K, YD-019K, YD-019, YD-017R, YD-017, YD-012, YD-011H, YD-011S, YD-011, YDF-2004, YDF-2001 (Kukdo Chemical Co., Ltd.), etc. Examples of phenol novolac epoxy resins may include EPIKOTE 152 and EPIKOTE 154 (Yuka Shell Epoxy Co., Ltd.); EPPN-201 (Nippon Kayaku Co., Ltd.); DN-483 (Dow Chemical Company); YDPN-641, YDPN-638A80, YDPN-638, YDPN-637, YDPN-644, YDPN-631 (Kukdo Chemical Co., Ltd.), etc. Examples of o-cresol novolac epoxy resins may include YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, YDCN-500-90PA75 (Kukdo Chemical Co., Ltd.); EOCN-102S, EOCN-103S, EOCN-104S, EOCN-1012, EOCN-1025, EOCN-1027 (Nippon Kayaku Co., Ltd.); YDCN-701, YDCN-702, YDCN-703, YDCN-704 (Tohto Kagaku Co., Ltd.); Epiclon N-665-EXP (Dainippon Ink and Chemicals, Inc.), etc. Examples of bisphenol novolac epoxy resins may include KBPN-110, KBPN-120, KBPN-115 (Kukdo Chemical Co., Ltd.), etc. Examples of polyfunctional epoxy resins may include Epon 1031S (Yuka Shell Epoxy Co., Ltd.); Araldite 0163 (Ciba Specialty Chemicals); Detachol EX-611, Detachol EX-614, Detachol EX-25-12614B, Detachol EX-622, Detachol EX-512, Detachol EX-521, Detachol EX-421, Detachol EX-411, Detachol EX-321 (NAGA Celsius Temperature Kasei Co., Ltd.); EP-5200R, KD-1012, EP-5100R, KD-1011, KDT-4400A70, KDT-4400, YH-434L, YH-434, YH-300 (Kukdo Chemical Co., Ltd.), etc. Examples of amine epoxy resins may include EPIKOTE 604 (Yuka Shell Epoxy Co., Ltd.); YH-434 (Tohto Kagaku Co., Ltd.); TETRAD-X and TETRAD-C (Mitsubishi Gas Chemical Company Inc.); ELM-120 (Sumitomo Chemical Industry Co., Ltd.), etc. Examples of heterocyclic epoxy resins may include PT-810 (Ciba Specialty Chemicals). Examples of substituted epoxy resins may include: ERL-4234, ERL-4299, ERL-4221, ERL-4206 (UCC Co., Ltd.), etc. Examples of naphthol epoxy resins may include Epiclon HP-4032, Epiclon HP-4032D, Epiclon HP-4700, and Epiclon HP-4701 (Dainippon Ink and Chemicals, Inc.).

The epoxy resin may be present in an amount of about 1 to about 30 parts by weight, for example, about 5 to about 20 parts by weight, based on 100 parts by weight of the adhesive film in terms of solid content. Within this range, high reliability and a good void removal effect may be attained.

Amine Curing Agent

Any suitable amine curing agent may be used. Examples of amine curing agents may include 3,3'-diaminobenzidine, 4,4'-diaminodiphenyl methane, 4,4'- or 3,3'-diaminodiphenyl sulfone, 4,4'-diaminobenzophenone, p-phenylenediamine, m-phenylenediamine, m-toluenediamine, 4,4'-diaminodiphenyl ether, 3,3'-diaminobenzophenone, 1,4'- or 1,3'-bis (4- or 3-aminocumyl)benzene, 1,4'-bis(4- or 3-aminophenoxy)benzene, 2,2'-bis[4-(4- or 3-aminophenoxy)phenyl] propane, bis[4-(4- or 3-aminophenoxy)phenyl]sulfone, 2,2'-bis[4-(4- or 3-aminophenoxy)phenyl]hexafluorosulfone, 2,2'-bis[4-(4- or 3-aminophenoxy)phenyl]hexafluoropropane, 4,4'-diamino-3,3',5,5'-tetrabutyldiphenylketone, 4,4'-diamino-3,3',5,5'-tetraethyldiphenylketone, 4,4'-diamino-3,3',5,5'-tetra-n-propyldiphenylketone, 4,4'-diamino-3,3',5,5'-tetraisopropyldiphenylketone, 4,4'-diamino-3,3',5,5'-tetramethyldiphenylketone, 4,4'-diamino-3,3',5,5'-tetra-n-propyldiphenylmethane, 4,4'-diamino-3,3'5,5'-tetramethyldiphenylmethane, 4,4'-diamino-3,3'5,5'-tetraisopropyldiphenylmethane, 4,4'-diamino-3,3'5,5'-tetraethyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diethyldiphenylmethane, 4,4'-diamino-3,5'-dimethyl-3',5'-diethyldiphenylmethane, 4,4'-diamino-3,5-dimethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimethyl-5',5'-dibutyldiphenylmethane, 4,4'-diamino-3,3'-diethyl-5',5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-methyl-3'-butyldiphenylmethane, 4,4'-diamino-3-isopropyl-3'-butyldiphenylmethane, 2,2-bis(4-amino-3,5-dimethylphenyl)propane, 2,2-bis(4-amino-3,5-diethylphenyl)propane, 2,2-bis(4-amino-3,5-di-n-propylphenyl)propane, 2,2-bis(4-amino-3,5-diisopropylphenyl)propane, 2,2-bis(4-amino-3,5-dibutylphenyl)propane, 4,4'-diamino-3,3',5,5'-tetramethyldiphenylbenzanilide, 4,4'-diamino-3,3',5,5'-tetraethyldiphenylbenzanilide, 4,4'-diamino-3,3',5,5'-tetra-n-propyldiphenylbenzanilide, 4,4'-diamino-3,3',5,5'-tetraisopropyldiphenylbenzanilide, 4,4'-diamino-3,3',5,5'-tetrabutyldiphenylbenzanilide, 4,4'-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'-tetramethyldiphenylether, 4,4'-diamino-3,3',5,5'-tetraethyldiphenylether, 4,4'-diamino-3,3',5,5'-tetra-n-propyldiphenylether, 4,4'-diamino-3,3',5,5'-tetraisopropyldiphenylether, 4,4'-diamino-3,3',5,5'-tetrabutyldiphenylether, 3,3'-diaminobenzophenone, 3,4-diaminobenzophenone, 3,3'-diaminodiphenylether, 3,3'-diaminodiphenylmethane, 3,4-diaminodiphenylmethane, 2,2'-diamino-1,2-diphenylethane or 4,4'-diamino-1,2-diphenylethane, 2,4-diaminodiphenylamine, 4,4'-diamino octafluorobiphenyl, o-dianisidine, or the like, without being limited thereto. These may be used alone or as a mixture of two or more thereof.

For example, as the amine curing agent, a diamino diphenyl sulfone curing agent may be used.

The amine curing agent may be present in an amount of about 0.1 to about 20 parts by weight, for example, about 1 to about 10 parts by weight, based on 100 parts by weight of the adhesive film in terms of solid content. Within this range, it may be possible to suppress void generation and to obtain efficient void removal upon molding.

Phenolic Curing Agent

Any suitable phenolic curing agent may be used. Examples of phenolic curing agents may include bisphenol type resins, such as bisphenol A, bisphenol F, bisphenol S, and the like; phenol novolac resins; bisphenol A novolac resins; and phenolic resins such as xylene, cresol novolac, biphenyl resins, and the like, without being limited thereto.

Commercially available phenolic curing agents may include the followings. Examples of phenol curing agent may include H-1, H-4, HF-1M, HF-3M, HF-4M, and HF-45 (Meiwa Plastic Industries Co., Ltd.); examples of paraxylene phenolic curing agents may include MEH-78004S, MEH-7800SS, MEH-7800S, MEH-7800M, MEH-7800H, MEH-7800HH, and MEH-78003H (Meiwa Plastic Industries Co., Ltd.), KPH-F3065 (Kolong Industries Co., Ltd.); examples of biphenyl curing agents may include MEH-7851SS, MEH-7851S, MEH7851M, MEH-7851H, MEH-78513H, and MEH-78514H (Meiwa Plastic Industries Co., Ltd.), and KPH-F4500 (Kolong Industries Co., Ltd.); and examples of triphenylmethyl curing agents may include MEH-7500, MEH-75003S, MEH-7500SS, MEH-7500S, MEH-7500H (Meiwa Plastic Industries Co., Ltd.), or the like. These may be used alone or as mixtures thereof As the phenolic curing agent, bisphenol A or bisphenol F having an equivalent weight from 100 g/eq to 150 g/eq may be used.

The phenolic curing agent may be present in an amount of about 0.1 to about 20 parts by weight, for example, about 1 to about 10 parts by weight, based on 100 parts by weight of the adhesive film in terms of solid content. When the amount of the phenolic curing agent is within this range, deterioration in adhesion and curing properties of the adhesive film may be reduced or prevented. Within this range of the phenolic curing agent, it may be possible to suppress void generation and to obtain a desired effect in removal of voids upon molding.

A mole % ratio (y/x) of the amine curing agent (y) to the phenolic curing agent (x) may range from about 0.3 to about 10, for example, from about 0.5 to about 10. Within this range, efficient acid catalysis reaction of the phenolic curing agent with respect to the amine curing agent may be obtained to achieve suitable curing reaction, and the amine curing agent may be provided in a suitable amount, thereby facilitating efficient removal of voids upon molding.

Fillers

The adhesive composition according to embodiments may include fillers to help adjust melt viscosity by the provision of thixotropic properties. Any suitable filler may be used. As the fillers, inorganic or organic fillers may be used as desired. Examples of inorganic fillers may include metal powders, such as gold, silver, copper and nickel powders; and a material derived from metals and/or nonmetals, such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, ceramics, and the like. Examples of organic fillers include carbon, rubber, polymer fillers, and the like. Although there is no particular restriction as to the shape and size of the filler, the fillers may be spherical fillers and may have an average particle size ranging from about about 500 nm to about 10 µm.

In an implementation, the fillers may be spherical silica fillers having an average particle size of about 5 µm to about 20 µm.

The fillers may be present in an amount of about 1 to about 30 parts by weight, for example, about 5 to about 20 parts by weight, based on 100 parts by weight of the adhesive film in terms of solid content. Within this range, it may be possible to obtain sufficient effects of the fillers while preventing deterioration in adhesion with respect to an adherend. Further, within this range, high flowability, film formability and adhesion may be obtained.

Silane Coupling Agent

The adhesive film may further include a silane coupling agent to help enhance adhesion between the surface of an inorganic material, such as silica and an organic material via chemical coupling therebetween during blending of the compositions.

Any suitable silane coupling agent may be used. Examples of silane coupling agent may include: epoxy group-containing silane coupling agents, such as 2-(3,4-epoxycyclohexyl)-ethyltrimethoxysilane, 3-glycidoxypropyltrimethoxysilane and 3-glycidoxypropyltriethoxysilane; amine group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine and N-phenyl-3-aminopropyltrimethoxysilane; mercapto-containing silane coupling agents, such as 3-mercaptopropylmethyldimethoxysilane and 3-mercaptopropyltriethoxysilane; and isocyanato-containing silane coupling agents, such as 3-isocyanatopropyltriethoxysilane. These silane coupling agents may be used alone or as a mixture of two or more thereof.

The coupling agent may be present in an amount of about 0.01 to about 10 parts by weight, for example, about 0.1 to about 5 parts by weight, based on 100 parts by weight of the adhesive film in terms of solid content. Within this range, high adhesion reliability can be obtained and the occurrence of bubbles can be reduced.

Curing Accelerator

The curing accelerator suitable for use in the adhesive film may serve to reduce a curing time of the epoxy resin during a semiconductor process. Any suitable curing accelerator may be used, such as melamine, imidazole or triphenylphosphine curing accelerators or catalysts. Examples of commercially available imidazole curing accelerators may include PN-23, PN-40 (Ajinomoto Fine Technology Co., Inc.), 2P4MZ, 2MA-OK, 2MAOK-PW, 2P4MHZ (Shikoku Chemicals Corp.), TPP-K, TPP-MK (HOKKO Chemical Industry Co., Ltd.), etc. These may be used alone or as a mixture of two or more thereof.

The curing accelerator may be present in an amount of about 0.01 to about 10 parts by weight, for example, about 0.03 to about 5 parts by weight, based on 100 parts by weight of the adhesive film in terms of solid content. Within this range, high heat resistance and maintenance stability can be attained while ensuring sufficient reaction of the epoxy resin.

Ion Adsorbent

The adhesive film may further include an ion absorbent to absorb ionic impurities while realizing insulation reliability upon moisture absorption. Any suitable ion adsorbent may be used. Examples of ion absorbents may include triazine thiol compounds, zirconium compounds, antimony bismuth compounds, magnesium aluminum compounds, and the like.

Organic Solvent

The adhesive film according to embodiments may further include an organic solvent. The solvent may serve to reduce the viscosity of the adhesive composition, thereby facilitating film formation. Examples of organic solvents may include toluene, xylene, propylene glycol monomethyl ether acetate, benzene, acetone, methylethylketone, tetrahydrofuran, dimethylformamide, and cyclohexanone.

There is no need for a special apparatus or equipment for forming the adhesive film according to embodiments, and any method generally used in the art may be used to manufacture the adhesive film.

For example, the adhesive film may be manufactured by the following method. In this method, the respective components as described above may be dissolved in a solvent, and sufficiently kneaded using a bead-mill, followed by depositing the resultant on a polyethylene terephthalate (PET) film subjected to release treatment, and drying in an oven at 100° C. for 10~30 minutes to prepare an adhesive film having a suitable thickness.

The adhesive film preferably may have a thickness of about 5 µm to about 200 µm, for example, from about 10 µm to about 100 µm, or about 15 to about 60 µm. Within this range, deterioration of the adhesive film in terms of void characteristics after molding may be prevented. Excellent PCB (printed circuit board) gap-filling capability may be ensured while providing economic feasibility.

In an implementation, embodiments provide an adhesive film that contains both an amine curing agent and a phenolic curing agent. A ratio (b/a) of storage modulus (b) at 170° C. after 4 curing cycles to storage modulus (a) at 40° C. before curing may range from about 1.5 to about 3.0. Here, each of the curing cycles consists of curing at 125° C. for 1 hour and curing at 150° C. for 10 minutes.

The term "storage modulus (a) at 40° C. before curing" refers to a storage modulus value of the adhesive film at 40° C., which is obtained by stacking the adhesive film to a thickness of 400~500 µm at 60° C., followed by measuring using an advanced rheometric expansion system (ARES) type rheometer under conditions of a temperature increasing rate of 50° C./minutes, a strain of 5%, and a frequency of 1 rad.

Here, the term "post-curing storage modulus (b)" refers to a storage modulus value of the adhesive film at 170° C., which is obtained by stacking the adhesive film to a thickness of 400~500 μm at 60° C., curing the sample over a total of four cycles, each cycle consisting of semi-curing in an oven at 125° C. for 1 hour and on a hot plate at 150° C. for 10 minutes, followed by measuring using ARES under conditions of a temperature increasing rate of 50° C./minutes, a strain of 5%, and a frequency of 1 rad.

The ratio (b/a) of storage modulus before and after curing may range from about 1.5 to about 3.0. Within this range, it may be possible to suppress void generation during die attachment and to facilitate removal of voids upon EMC (Epoxy Molding Compound) molding, while providing excellent post-molding die-shear strength and reliability.

In one embodiment, the adhesive film may have a post-curing die-shear strength of 9 kgf or more after curing at 125° C. for 1 hour, at 150° C. for 10 minutes and at 175° C. for 1 hour. When the die-shear strength of the adhesive film is 9 kgf or more, the adhesive film may have high strength and thus may suppress failure due to swelling under thermal impact conditions, thereby providing high reliability.

The post-curing die-shear strength was measured by the following procedure. A 720 μm thick wafer was cut into chips having a size of 5×5 mm. The chips were laminated together with the adhesive film at 60° C., and were cut to leave behind a bonded portion only. Then, an upper chip having a size of 5×5 mm was placed on a wafer having a size of 10×10 mm, followed by application of a force of 10 kgf on a hot plate at 120° C. for 5 seconds. Then, the sample was subjected to semi-curing in an oven at 125° C. for 1 hour, left on a hot plate at 150° C. for 10 minutes to simulate wire-bonding conditions, and cured at 175° C. for 1 hour as a condition for EMC curing. Then, the die-shear strength of the adhesive film was measured at 250° C. using a Dage 4000 with a 100 N bar at a height of 10 μm at 100 mm/s.

In another embodiment, the adhesive film may have a void area ratio of 5% or less on an adhesive film-attached area, after curing at 125° C. for 1 hour and at 150° C. for 1 hour, molding at 175° C. for 60 seconds, and mold curing at 175° C. for 1 hour.

If the void area ratio exceeds 5% on the adhesive film-attached area, the adhesive film may be deteriorated in adhesive strength and thermal and electric conductivity, and may cause die cracking, thereby providing an undesirable influence to quality and reliability of devices. If the void area ratio is less than 5% on the adhesive film-attached area, such deterioration of the adhesive film in adhesive strength and thermal and electric conductivity, and die cracking may be reduced or prevented. Thus, the adhesive film preferably has a void area ratio of 5% or less on the adhesive film-attached area.

The term "void area ratio of 5% or less" does not indicate that the void area ratio numerically includes 0 and a negative value less than 0, but rather, indicates that the void area has a low positive limit approaching 0.

To measure the void area ratio, the adhesive film was laminated together with a cover glass of 10×10 mm at 60° C. and cut to leave behind a bonded portion only. Then, the sample was pressed on a printed circuit board (PCB) under a force of 1 kgf for 1 second, cured at 125° C. for 1 hour and at 150° C. for 1 hour, and molded with an EMC (SG-8500B, Cheil Industries Co., Ltd., Korea) at 175° C. for 60 seconds. After mold curing at 175° C. for 1 hour, the mold covering the cover glass was ground from the sample using a grinder and voids were observed using a low magnification microscope. Here, the term "void area ratio" refers to a digitized value of a post-molding void area with respect to an adhesive film-attached area in percentage unit ((void area ratio/adhesive film-attached area)×100)).

In one embodiment, the adhesive film may have a die-shear strength of 9 kgf or more after curing at 125° C. for 1 hour, at 150° C. for 10 minutes and at 175° C. for 1 hour, and a post-curing storage modulus at 170° C. of $5.0 \times 10^6$ dyne/cm$^2$ or more.

When the adhesive film has a post-curing storage modulus at 170° C. of $5.0 \times 10^6$ dyne/cm$^2$ or more, it may sufficiently endure a pressure of 1 ton applied to the mold at 170° C. such that the chip is not deviated from the mold, thereby eliminating molding failure. In this case, the adhesive film may have excellent die-shear strength and reflow resistance, thereby providing high reliability.

Here, the term "post-curing storage modulus" refers to a storage modulus value at 170° C., which is obtained by stacking the adhesive film to a thickness of 400~500 μm at 60° C., curing the sample over a total of four cycles, each cycle consisting of semi-curing in an oven at 125° C. for 1 hour and on a hot plate at 150° C. for 10 minutes, followed by measuring using ARES under conditions of a temperature increasing rate of 50° C./minutes, a strain of 5%, and a frequency of 1 rad.

In a further aspect, embodiments provide an electronic device, for example, a semiconductor device, that is connected by the adhesive film.

The electronic device may include a wiring substrate, the adhesive film attached to a chip mounting surface of the wiring substrate, and a semiconductor chip mounted on the adhesive film. For example, FIG. 1 illustrates a chip 100 attached to the substrate (e.g., a wiring substrate or another chip) 300 by using the adhesive film 200. Any suitable wiring substrate and semiconductor chip may be used. Further, any suitable method for manufacturing the electronic device may be used.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

Example 1

Preparation of Adhesive Film Containing Both an Amine Curing Agent and a Phenolic Curing Agent A mixture of 67.7 parts by weight of an elastomer resin (AD-102S, Cheil Industries Co., Ltd.), 13.5 parts by weight of an epoxy resin (EPPN-502H, Japan Chemical Co., Ltd.), 7.8 parts by weight of an amine curing agent (DDS, Wako), 1.5 parts by weight of a phenolic curing agent (BPA, Kukdo Chemical Co., Ltd.) (hydroxyl group equivalent weight: 114 g/eq), 0.5 parts by weight of a silane coupling agent (S-510, Chisso), and 9 parts by weight of fillers (R-972, Degussa) based on 100 parts by weight of the adhesive film in terms of solid content was dissolved in cyclohexanone as an organic solvent, sufficiently kneaded using a beads-mill, and deposited on a PET film subjected to release treatment using an applicator. Then, the mixture was dried in an oven at 100° C. for 20 minutes, thereby preparing a 60 μm thick adhesive film.

Example 2

Preparation of Adhesive Film Containing both Amine Curing Agent and Phenolic Curing Agent The adhesive film was prepared in the same manner as in Example 1 except that 12.3 parts by weight of the epoxy resin (EPPN-502H, Japan Chemical Co., Ltd.), 5.5 parts by weight of the amine curing agent (DDS, Wako), and 5.0 parts by weight of the phenolic curing agent (BPA, Kukdo Chemical Co., Ltd.) were used based on 100 parts by weight of the adhesive film in terms of solid content.

Example 3

Preparation of Adhesive Film Containing Both Amine Curing Agent and Phenolic Curing Agent The adhesive film was prepared in the same manner as in Example 1 except that 11.7 parts by weight of the epoxy resin (EPPN-502H, Japan Chemical Co., Ltd.), 3.9 parts by weight of the amine curing agent (DDS, Wako), and 7.2 parts by weight of the phenolic curing agent (BPA, Kukdo Chemical Co., Ltd.) were used based on 100 parts by weight of the adhesive film in terms of solid content.

Comparative Example 1

Preparation of Adhesive Film Containing Amine Curing Agent Alone as Curing Agent The adhesive film was prepared in the same manner as in Example 1 except that 13.8 parts by weight of the epoxy resin (EPPN-502H, Japan Chemical Co., Ltd.) and 9 parts by weight of the amine curing agent (DDS, Wako) were used based on 100 parts by weight of the adhesive film in terms of solid content, and the phenolic curing agent was not used.

Comparative Example 2

Preparation of Adhesive Film Containing Phenolic Curing Agent Alone as Curing Agent The adhesive film was prepared in the same manner as in Example 1 except that 10.1 parts by weight of the epoxy resin (EPPN-502H, Japan Chemical Co., Ltd.) and 12.7 parts by weight of the phenolic curing agent (BPA, Kukdo Chemical Co., Ltd.) were used based on 100 parts by weight of the adhesive film in terms of solid content, and the amine curing agent was not used.

Comparative Example 3

Preparation of Adhesive Film Containing both Amine Curing Agent and Phenolic Curing Agent The adhesive film was prepared in the same manner as in Example 1 except that 11.1 parts by weight of the epoxy resin (EPPN-502H, Japan Chemical Co., Ltd.), 2.5 parts by weight of the amine curing agent (DDS, Wako), and 9.2 parts by weight of the phenolic curing agent (BPA, Kukdo Chemical Co., Ltd.) were used based on 100 parts by weight of the adhesive film in terms of solid content.

The following Table 1 shows the composition of each of the adhesive films prepared in Examples 1 to 3 and Comparative Examples 1 to 3 in terms of parts by weight.

TABLE 1

|  | Example 1 | Example 2 | Example 3 | Comparative Example 1 | Comparative Example 2 | Comparative Example 3 |
|---|---|---|---|---|---|---|
| Elastomer resin | 67.7 | 67.7 | 67.7 | 67.7 | 67.7 | 67.7 |
| Epoxy resin | 13.5 | 12.3 | 11.7 | 13.8 | 10.1 | 11.1 |
| Amine curing agent | 7.8 | 5.5 | 3.9 | 9 | — | 2.5 |
| Phenolic curing agent | 1.5 | 5 | 7.2 | — | 12.7 | 9.2 |
| Silane coupling agent | 0.5 | 0.5 | 0.5 | 0.5 | 0.5 | 0.5 |
| Filler | 9 | 9 | 9 | 9 | 9 | 9 |
| Total (parts by weight) | 100 | 100 | 100 | 100 | 100 | 100 |

Experimental Example 1

Measurement of Pre-Curing Storage Modulus

Each of the adhesive films prepared in Examples 1 to 3 and Comparative Examples 1 to 3 was laminated to a thickness of 400~500 μm at 60° C., followed by measuring storage modulus at 40° C. using ARES under conditions of a temperature increasing rate of 50° C./min, a strain of 5%, and a frequency of 1 rad.

Experimental Example 2

Measurement of Post-Curing Storage Modulus

Each of the adhesive films prepared in Examples 1 to 3 and Comparative Examples 1 to 3 was laminated to a thickness of 450 μm at 60° C., followed by curing over a total of 4 cycles, each cycle including semi-curing in an oven at 125° C. for 1 hour and on a hot plate at 150° C. for 10 minutes. Then, storage modulus at 170° C. was measured using ARES under conditions of a temperature increasing rate of 50° C./min, a strain of 5%, and a frequency of 1 rad.

Experimental Example 3

Observation of Void after Molding

Each of the adhesive films prepared in Examples 1 to 3 and Comparative Examples 1 to 3 was laminated together with a cover glass of 10×10 mm at 60° C., pressed onto a PCB under a force of 1 kgf for 1 second, cured at 125° C. for 1 hour and at 150° C. for 1 hour, and molded with an EMC (SG-8500B, Cheil Industries Co., Ltd., Korea) at 175° C. for 60 seconds. After mold curing at 175° C. for 1 hour, the sample was polished by a polisher, followed by observation of voids. As measured using a grid scale with reference to an area of the PCB to which the adhesive film was attached, a void area ratio of 5% or less was evaluated as a very good void characteristic, a void area ratio of greater than 5% to 10% was evaluated as a good void characteristic, and a void area ratio of greater than 10% was evaluated as a poor void characteristic.

Experimental Example 4

Measurement of Post-Curing Die-Shear Strength

A 720 μm thick wafer coated with a dioxide layer was cut into chips having a size of 5×5 mm. The chips were laminated at 60° C. with each of the adhesive films prepared in Examples 1 to 3 and Comparative Examples 1 to 3, and were cut to leave behind a bonded portion only. An upper chip having a size of 5×5 mm was placed on a wafer having a size of 10×10 mm, followed by application of a force of 10 kgf on a hot plate at 120° C. for 5 seconds to attach the chip to the adhesive film, followed by curing in an oven at 125° C. for 1 hour and on a hot plate at 150° C. for 10 minutes or by curing in the oven at 125° C. for 1 hour and on the hot plate at 150° C. for 10 minutes and at 175° C. for 1 hour. Then, the die-shear strength was measured at 250° C. using a Dage 4000 with a 100 N bar at a height of 10 μm and 100 mm/s.

Experimental Example 5

Evaluation of Reflow Resistance

Each of the adhesive films prepared in Examples 1 to 3 and Comparative Examples 1 to 3 was mounted on a 150 μm thick wafer coated with a dioxide layer and having a size of 10×10 mm, and pressed on a PCB under a force of 1 kgf for 1 second, followed by curing at 125° C. for 1 hour and at 150° C. for 1 hour. Then, the resultant was molded with an EMC (SG-8500BC, Cheil Industries, Korea) at 175° C. for 60 seconds, followed by post-curing at 175° C. for 1 hour. After post curing, the prepared specimen was allowed to absorb moisture in a constant temperature/humidity chamber at 85° C., 85% RH for 4 hours, and IR reflow was conducted three times at a maximum of 260° C. Then, the specimen was evaluated as to peeling through a t-scan technique of SAT (Sonix quantum 350). Occurrence of peeling was evaluated as poor, and no peeling was evaluated as good.

The following Tables 2 and 3 show the mole % ratio of the amine/phenolic curing agents in the adhesive films prepared in Examples 1 to 3 and Comparative Examples 1 to 3, and measurement results of Experimental Example 1 to 5.

TABLE 2

|  |  | Example 1 | Example 2 | Example 3 |
|---|---|---|---|---|
| Mole % ratio of amine/phenolic curing agent |  | 5.1 ≈ (67.2/13.18) | 0.5 ≈ (33.3/66.7) | 0.33 ≈ (25/75) |
| Storage modulus ($10^6$ dyne/cm$^2$) | Before curing (40° C.) | 4.91 | 4.74 | 4.50 |
|  | After curing (170° C.) | 10.1 | 8.3 | 7.1 |
|  | After/before ratio | 2.06 | 1.75 | 1.58 |
| Void |  | Very good | Very good | Good |
| Die-shear strength (kgf) |  | 12.85 | 11.08 | 10.74 |
| Reflow resistance |  | Good | Good | Good |

TABLE 3

|  |  | Comparative Example 1 | Comparative Example 2 | Comparative Example 3 |
|---|---|---|---|---|
| Mole % ratio of amine/phenolic curing agent |  | amine 100% | phenol 100% | 0.17 ≈ (14.3/85.7) |
| Storage modulus ($10^6$ dyne/cm$^2$) | Before curing (40° C.) | 4.34 | 3.26 | 4.07 |
|  | After curing (170° C.) | 2.63 | 2.30 | 4.9 |
|  | After/before ratio | 0.61 | 0.71 | 1.2 |
| Void |  | Poor | Poor | good |
| Die-shear strength (kgf) |  | 5.82 | 0.93 | 8.82 |
| Reflow resistance |  | Poor | Poor | Poor |

Comparing Examples 1 to 3 with Comparative Examples 1 and 2, it could be seen that the adhesive films containing both the amine curing agent and the phenolic curing agent exhibited a large difference between the storage modulus before and after curing. In addition, the adhesive films containing both the amine curing agent and the phenolic curing agent exhibited very good void characteristics and had a high post-curing storage modulus, thereby providing excellent die-shear strength and reflow resistance.

On the other hand, comparing Examples 1 to 3 with Comparative Examples 1 and 2, it could be seen that, when the mole % ratio of the amine curing agent (y) to phenolic curing agent (x) was less than 0.3, there was disadvantageously no variation between storage modulus before and after curing. In addition, when the mole % ratio was less than 0.3, the adhesive film exhibited good void characteristics, but had low post-curing storage modulus, thereby providing unsatisfactory die-shear strength and reflow resistance.

By way of summation and review, a circuit board on which a semiconductor wafer is stacked may have an uneven surface due to wiring, so that voids could be generated in an attachment interface between a die and the adhesive film and between the semiconductor chips during die attachment. When large amounts of voids are generated in the attachment interface, there can be problems such as deterioration in attachment strength, deterioration in thermal and electrical conductivity, die cracking, and the like, which can have a negative influence on quality and reliability of devices.

When an adhesive film having high flowability is used in order to suppress void generation in the die-attach process, die-shear strength may be lowered, thereby causing a deterioration of processability. On the other hand, an adhesive film having high storage modulus provides high die-shear strength, but may make it difficult to remove voids not only in the die-attach process but also in the EMC molding process.

An acryl binder and a phenolic curing agent may be used in compositions of a die-attach film (DAF). However, the phenol curing system does not allow easy removal of voids and provides a low modulus and die-shear strength to cured products, thereby providing significantly low reliability.

Therefore, an adhesive film that exhibits excellent die-shear strength and can suppress void generation in a die-attach process while allowing easy removal of voids, if any, upon EMC molding is desirable.

Embodiments provide an adhesive film that contains both an amine curing agent and phenolic curing agent. In more detail, embodiments may provide an adhesive film for semiconductors that may exhibit excellent properties in terms of void characteristics and reliability using an amine curing agent and a phenolic curing agent in a suitable ratio in manufacture of the adhesive film. More particularly, the adhesive film may exhibit a high variation rate of 1.5 to 3.0 between storage modulus before curing and storage modulus at 170°

C. after 80% curing. The adhesive film may have flexibility to suppress void generation upon die attachment. The adhesive film may facilitate removal of voids to control a void area on an attachment interface upon EMC (Epoxy Molding Compound) molding. The adhesive film may have hardness to provide good die-shear strength and reflow resistance after curing, thereby ensuring good void characteristics and high reliability.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An adhesive film, comprising:
   an amine curing agent, wherein the amine curing agent is a diamino diphenyl sulfone; and
   a phenolic curing agent, wherein the phenolic curing agent is bisphenol A or bisphenol F,
   wherein the adhesive film has a ratio of a storage modulus at 170° C. after 80% or more curing to a storage modulus at 40° C. before curing in the range of about 1.5 to about 3.0.

2. The adhesive film as claimed in claim 1, wherein the adhesive film has a post-molding die-shear strength of 9 kgf or more after curing at 125° C. for 1 hour, at 150° C. for 10 minutes, and at 175° C. for 1 hour.

3. The adhesive film as claimed in claim 1, wherein the adhesive film has a void area ratio of 5% or less on an adhesive film-attached area, after curing at 125° C. for 1 hour and at 150° C. for 1 hour, molding at 175° C. for 60 seconds, and mold curing at 175° C. for 1 hour.

4. An adhesive film, comprising:
   an amine curing agent; and
   a phenolic curing agent,
   wherein:
   a mole % ratio of the amine curing agent to the phenolic curing agent ranges from about 0.3 to about 10; and
   the adhesive film having a die-shear strength of 9 kgf or more after curing at 125° C. for 1 hour and at 175° C. for 1 hour, and a storage modulus at 170° C. of $5.0 \times 10^6$ dyne/cm$^2$ or more after 80% curing.

5. The adhesive film as claimed in claim 4, wherein the adhesive film has a void area ratio of 5% or less on an adhesive film-attached area, after curing at 125° C. for 1 hour and at 150° C. for 1 hour, molding at 175° C. for 60 seconds, and mold curing at 175° C. for 1 hour.

6. The adhesive film as claimed in claim 4, wherein the amine curing agent is diamino diphenyl sulfone.

7. The adhesive film as claimed in claim 4, wherein the phenolic curing agent is bisphenol A or bisphenol F.

8. An adhesive film, comprising:
   a binder resin;
   an epoxy resin;
   a filler;
   an amine curing agent, wherein the amine curing agent is a diamino diphenyl sulfone; and
   a phenolic curing agent, wherein the phenolic curing agent is a bisphenol A or bisphenol F,
   wherein a mole % ratio of the amine curing agent to the phenolic curing agent ranges from about 0.3 to about 10.

9. The adhesive film as claimed in claim 8, wherein a ratio of a storage modulus at 170° C. after 80% curing to a storage modulus at 40° C. before curing ranges from about 1.5 to about 3.0.

10. The adhesive film as claimed in claim 8, wherein the adhesive film has a die-shear strength of 9 kgf or more after curing at 125° C. for 1 hour, at 150° C. for 10 minutes, and at 175° C. for 1 hour.

11. The adhesive film as claimed in claim 8, wherein the adhesive film includes:
    about 40 to about 80 parts by weight of the binder resin;
    about 1 to about 30 parts by weight of the epoxy resin;
    about 1 to about 30 parts by weight of the filler;
    about 0.1 to about 20 parts by weight of the amine curing agent; and
    about 0.1 to about 20 parts by weight of the phenolic curing agent, based on 100 parts by weight of the adhesive film in terms of solid content.

12. The adhesive film as claimed in claim 8, wherein the binder resin is an elastomer resin.

13. An electronic device, comprising:
    a wiring substrate;
    an adhesive film attached to a chip mounting surface of the wiring substrate; and
    a semiconductor chip mounted on the adhesive film,
    wherein the adhesive film is the adhesive film as claimed in claim 1.

* * * * *